United States Patent [19]

Verhaverbeke et al.

[11] Patent Number: 5,922,624
[45] Date of Patent: Jul. 13, 1999

[54] METHOD FOR SEMICONDUCTOR PROCESSING USING MIXTURES OF HF AND CARBOXYLIC ACID

[75] Inventors: Steven Verhaverbeke, West Chester, Pa.; Mark Heyns, Linden, Belgium; Menso Hendriks, Soest, Netherlands; Rene de Blank, Heverlee, Belgium

[73] Assignee: IMEC vzw, Louvain, Belgium

[21] Appl. No.: 08/772,338

[22] Filed: Dec. 23, 1996

Related U.S. Application Data

[63] Continuation of application No. 08/557,065, filed as application No. PCT/EP94/01543, May 10, 1994, abandoned.

[30] Foreign Application Priority Data

May 13, 1993 [EP] European Pat. Off. .............. 93870080
May 10, 1994 [WO] WIPO ...................... PCT/EP94/01534

[51] Int. Cl.$^6$ .............................. C03C 15/00; B44C 1/22
[52] U.S. Cl. ............................................................ 438/743
[58] Field of Search ................................ 216/84; 438/743

[56] References Cited

U.S. PATENT DOCUMENTS

| | | |
|---|---|---|
| 4,749,440 | 6/1988 | Blackwood et al. . |
| 5,022,961 | 6/1991 | Izumi et al. ............................. 156/646 |
| 5,167,761 | 12/1992 | Westendorp et al. . |
| 5,213,622 | 5/1993 | Bohling et al. .............................. 134/3 |

FOREIGN PATENT DOCUMENTS

| | | |
|---|---|---|
| 0 272 799 | 6/1988 | European Pat. Off. . |
| 0 488 198 A1 | 6/1992 | European Pat. Off. . |
| 0 536 747 A2 | 4/1993 | European Pat. Off. . |
| 5 536 752 A2 | 4/1993 | European Pat. Off. . |
| 1 302 175 | 7/1970 | Germany . |

OTHER PUBLICATIONS

Iler et al., "The Colloid Chemistry of Silica and Silicates," Cornell University Press, Ithaca, NY (1955), Contents and pp. 252–255.

Robbins et al., "Chemical Etching of Silicon," J. Electrochem. Soc. 107:108–111 (1960).

Winters et al., "Gaseous Products from the Reaction of $XeF_2$ with Silicon," J. Appl. Phys. 54:1218–1223 (1983).

Wong, M., et al. (1991) Characterization of wafer cleaning and oxide etching using vapor–phase hydrogen fluoride. Journal of the Electorchemical Society 138(6):1799–1802.

Kern, W., et al. (1970) Cleaning solutions based on hydrogen peroxide for use in silicon semiconductor technology. RCA Review 187–206.

*Primary Examiner*—Donna C. Wortman
*Assistant Examiner*—Brenda G. Brumback
*Attorney, Agent, or Firm*—Knobbe, Martens, Olson & Bear, LLP

[57] ABSTRACT

Method for semiconductor processing comprising etching of oxide layers, especially etching thick $SiO_2$ layers and/or last step in the cleaning process wherein the oxide layers are etched in the gas phase with a mixture of hydrogen fluoride and one or more carboxylic acids, eventually in admixture with water.

18 Claims, 4 Drawing Sheets

Liquid/vapor phase diagram for Acetic Acid/$H_2O$ mixtures.

Time evolution of etch depth for a HF/Acetic acid vapor mixture.

METHOD FOR SEMICONDUCTOR PROCESSING USING MIXTURES OF HF AND CARBOXYLIC ACID

CROSS-REFERENCE TO RELATED PATENT APPLICATION

This is a continuation of U.S. patent application Ser. No. 08/557,065, filed Nov. 13, 1995 abandoned which is the U.S. national phase under 35 U.S.C. § 371 of International Application No. PCT/EP94/01543, filed May 10, 1994, which claims the priority of EPO 93-870080.4, May 13, 1993.

OBJECTS OF THE PRESENT INVENTION

The present invention is related to improvements in semiconductor processing using HF formulated mixtures. The invention is more specifically related to methods making use of these mixtures in gas phase etching techniques of oxide layers, especially etching $SiO_2$ layers and in the so-called last step in the cleaning process.

STATE OF THE ART AND BACKGROUND OF THE INVENTION

In the semiconductor processing, liquid HF mixtures are often used for etching thick $SiO_2$ layers or for etching chemical or native oxide layers.

For etching thick $SiO_2$ layers, usually buffered HF is used, which is a mixture of $NH_4F$ and HF, in the liquid phase, generally as a solution in water.

Moreover, as a last step in the cleaning process, usually a diluted HF step is used.

Etching of bare silicon wafers in HF solution and/or a final etch in HF solution generally in combination with the RCA-process have been the object of many experimentation and publications.

The RCA-cleaning process for bare or oxidized silicon wafers is based on a two-step oxidizing and complexing treatment with hydrogen peroxide solutions: an alkaline mixture at high pH and followed by an acidic mixture at low pH (W. Kern and D. Puotinen, "Cleaning Solutions Based on Hydrogen Peroxide for Use in Silicon Semiconductor Technology", RCA Review, 31, 187–206 (1970)).

"HF-last cleaning" result in a Si-surface free of silicon oxide and passivated with hydrogen. However, the execution of this process with liquid HF mixtures is very susceptible to contamination.

The etch bath, chemicals, rinsing water and air ambient need to be very clean to achieve good results. Otherwise, severe contamination of the wafers with particles, metals and organic material can occur during the etching rinsing or drying process. "HF-last" processing with liquid mixtures before gate oxidation is, therefore, still a point of controversy.

As an alternative, the etching can be performed with HF mixtures in the vapor phase to prevent recontamination from the liquid and during rinsing and drying of the wafers. By etching in the gas phase, recontamination from the liquid is omitted and the high susceptibility of the wafer for contamination during the drying stage is avoided. Furthermore, in the gas phase the etching of small features is facilitated while surface tension effects hamper this in the liquid phase.

Traditionally, the HF vapor etching is performed with a mixture of HF and $H_2O$ vapors. This is described in U.S. Pat. No. 4,749,440 of FSI for processes performed at near atmospheric pressures in a mode where the process gases are continuous flowing, the so-called dynamic mode. Because of controllability problems with this process, the process was improved by performing it at substantially reduced pressures (600 Pa-2000 Pa) and applying a different procedure, the so-called static mode (see also U.S. Pat. No. 5,167,761). Despite of these improvements, the controllability of the process is still problematic.

As an alternative, a method for etching silicon oxide by feeding anhydrous HF and alcohol vapor simultaneously into a reaction chamber is described in U.S. Pat. No. 5,022,961. However, this process suffers from the same limitations as the HF/water vapor process.

AIMS OF THE PRESENT INVENTION

The main aims of the present invention are to provide HF formulated mixtures operating in the gas phase which are more reliable than previous mixtures and which have an etching behavior which is very reproducible, which achieve good electrical results with respect to the oxides grown on oxide stripped silicon surfaces and which provide a reproducible and uniform process for etching of thick oxide layers.

Other objects and advantages of the present invention will appear to those skilled in the art from the detailed description of the invention to follow.

MAIN CHARACTERISTIC FEATURES OF THE INVENTION

In order to achieve the intended aims, especially for semiconductor processing, the present invention proposes the use in the gaseous phase of mixtures of hydrogen fluoride and one or more carboxylic acids, possibly in admixture with water vapor, gases such as Ar, $N_2$, $H_2$, HCl or organic solvents such as alcohols, ketones, aldehydes and esters.

The carboxylic acid which is used is generally acetic acid (HAc). However, other carboxylic acids having one or more carboxylic functional groups (—COOH) may be used.

The pressures of HF and carboxylic acid in the gas phase may vary between 1 Pa and $10^4$ Pa. The specific partial pressures of respectively the HF vapor and the carboxylic acid vapor are 300 Pa and 600 Pa in etching techniques of $SiO_2$ and last step cleaning operations. Water can be added to enhance the etch rate or influence the selectivity of the etch rate for different types of oxides. When water vapor is present, the partial pressure of water may vary between 1 Pa and $10^4$ Pa.

BRIEF DESCRIPTION OF THE DRAWINGS

In order to illustrate the state of the art and the advantages of the present invention, the following descriptions are to be used in conjunction with the accompanying drawings.

In these drawings.

DETAILED DESCRIPTION OF AN EMBODIMENT OF THE STATE OF THE ART

Traditionally, the HF vapor etching is performed with a mixture of HF and $H_2O$ vapors.

HF vapor can be generated by feeding a carrier gas like $N_2$ through a container with a mixture of liquid $HF/H_2O$. Alternatively, a bottle with anhydrous HF can be used as the source for HF vapor. In the latter case, it is found that anhydrous HF alone hardly etches $SiO_2$ at room temperature. The presence of $H_2O$ is therefore preferred to initiate the reaction according to the overall equation:

$$(H_2O)SiO_2 + 4HF \rightarrow SiF_4 + 2H_2O$$

The process can be performed in the static mode and in the dynamic mode.

In the static mode, the reactor is filled with a process gas up to a certain pressure and then the reactor is isolated for some time. Subsequently, the reactor is evacuated and the etch cycle can be repeated for a number of times. In the dynamic mode, a continuous flow of process gas is fed into the reactor which is maintained at a constant pressure.

Figure 1:
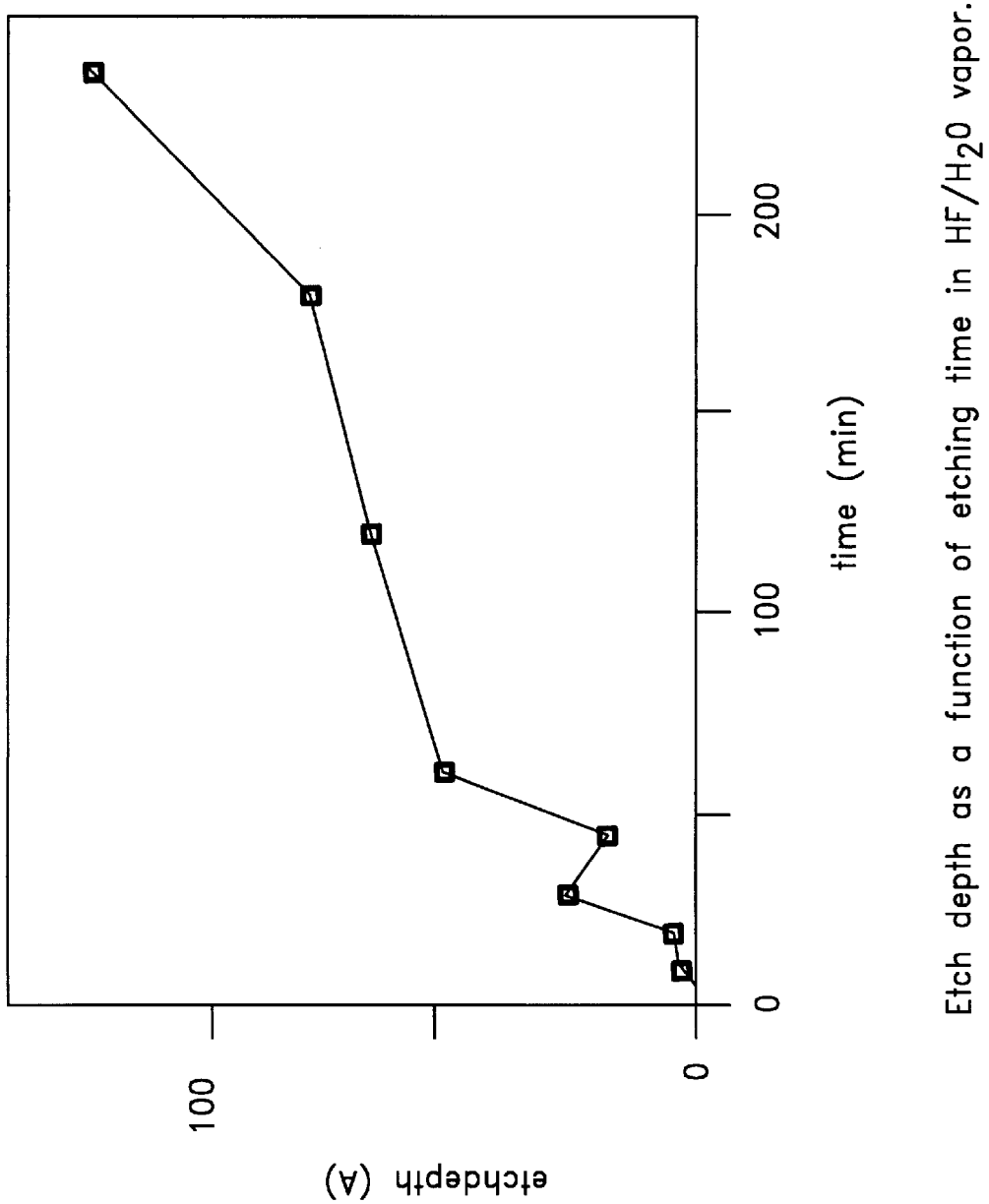
FIG. 1 is a diagram of the etch depth as a function of the etching time in HF/$H_2O$ vapors.

However, it is generally recognized that it is difficult to control the etching reaction of $SiO_2$ with gaseous HF/water mixtures and to apply the etching process with good repeatability. The reproducibility can be seen from etching experiments as a function of time. If the reproducibility is good, then all experiments should follow a smooth evolution with time. In FIG. 1, the etch depth in Å is shown as a function of etching time in a mixture of HF and $H_2O$ vapor for one static etch cycle. It is clear from this figure that the reproducibility is poor since the etching processes do not follow a smooth time evolution.

Furthermore, the process is inflicted with an incubation time: under the chosen conditions, the first 10 minutes very limited etching occurs, see FIG. 1. The incubation time is found to depend on the pretreatment of the wafers. An RCA-cleaning just prior to the HF vapor etching reduces the inhibition time. This is related to the concentration of adsorbed $H_2O$ molecules on the oxide surface.

The onset of the etching process critically depends on the amount of molecules adsorbed on the silicon oxide surface. Water adsorption on the silicon oxide surface in its turn is dependent on the number of OH centers already present on the surface and in this way is dependent on the quality of the oxide.

Uniform etching is another important criterion that determines the usefulness of the process. The uniformity within the wafer and from wafer to wafer for a process using a batch of 6 wafers is represented in table 1. In column 5 of said table 1 the standard deviation within the wafer is shown. As can be seen from these values, the standard deviation within the wafer is not very good (32%). Also there is quite a standard deviation from the wafer to wafer on the mean etch depth. In the presented case it is 27%. All these values show that the vapor $HF/H_2O$ mixture does etch the $SiO_2$ but has not a good performance regarding reproducibility, within wafer uniformity and wafer to wafer uniformity.

DETAILED DESCRIPTION OF THE PREFERRED EMBODIMENTS OF THE INVENTION

The present invention is based on the consideration that the good reproducibility of the etching operation may be obtained by use in the gas phase of the new mixtures of the present invention comprising carboxylic acid mixed with HF and possibly in admixture with $H_2O$.

Anhydrous HF hardly etches silicon oxide at room temperature. A catalyst is necessary to start the reaction. Although $H_2O$ can fulfil this role, the adsorption of $H_2O$ on the silicon oxide surface is dependent on the number of OH centers already present and in this way on the quality of the oxide. The adsorption of organic molecules shows a strongly reduced sensitivity for the amount of OH groups on the surface. Furthermore, the maximum density of adsorbed molecules strongly depends on the type of molecule. In table 2, the surface area occupied per adsorbed molecule is given for a number of different molecules. Obviously, acetic acid occupies the smallest surface area.

Among the various carboxylic acids, acetic acid is a good choice regarding melting point (17° C.), boiling point (118° C.) and the shape of the carboxylic acid/$H_2O$ liquid/vapor phase diagram. However, other carboxylic acids having similar properties might be equally good or better choices.

The reaction involves the formation of $SiF_4$ and $H_2O$ which are both gases at the used pressures:

$$(HAc)SiO_2 + HF \rightarrow SiF_4 + 2H_2O$$

The acetic acid only serves as catalyst

Figure 2:
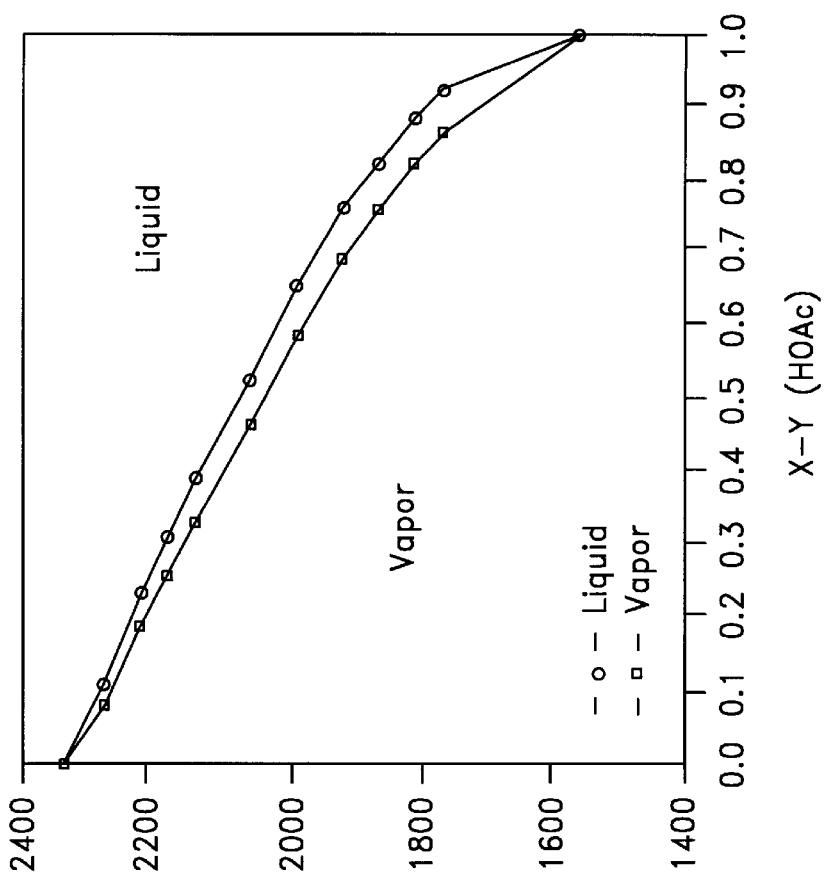
FIG. 2 is a liquid/vapor phase diagram of HAc/$H_2O$ mixtures.

The etching of $SiO_2$ by HF generates water on the wafer surface. This water is, together with the acetic acid and the HF, assumed to be present in the form of a thin liquid film on the surface of the wafer and must be transported away from the wafer surface by evaporation. In this respect the acetic acid/$H_2O$ phase diagram for liquid/vapor equilibria is determining. This phase diagram is shown in FIG. 2. As shown in the figure, the vapor and liquid curves are close together. This means that the composition of the vapor leaving the surface is close to the composition of the liquid on the surface. The shape of the curve implies that the vapor is even somewhat more water rich than the liquid. Consequently, the water generated on the surface can easily be transported away. For other organic liquids like alcohols, acetone, the liquid and vapor curves are far apart resulting in a large difference between composition of the liquid and the vapor. Furthermore, for the mentioned materials the shape of the curves is such that the vapor is substantially less water rich than the liquid. Hence the water is not easily removed from the surface, giving rise to a strong increase in surface water concentration in the course of the etching process. This results in a fundamental controllability problem of the etching process which is not present with carboxylic acids and especially acetic acid.

Figure 3:
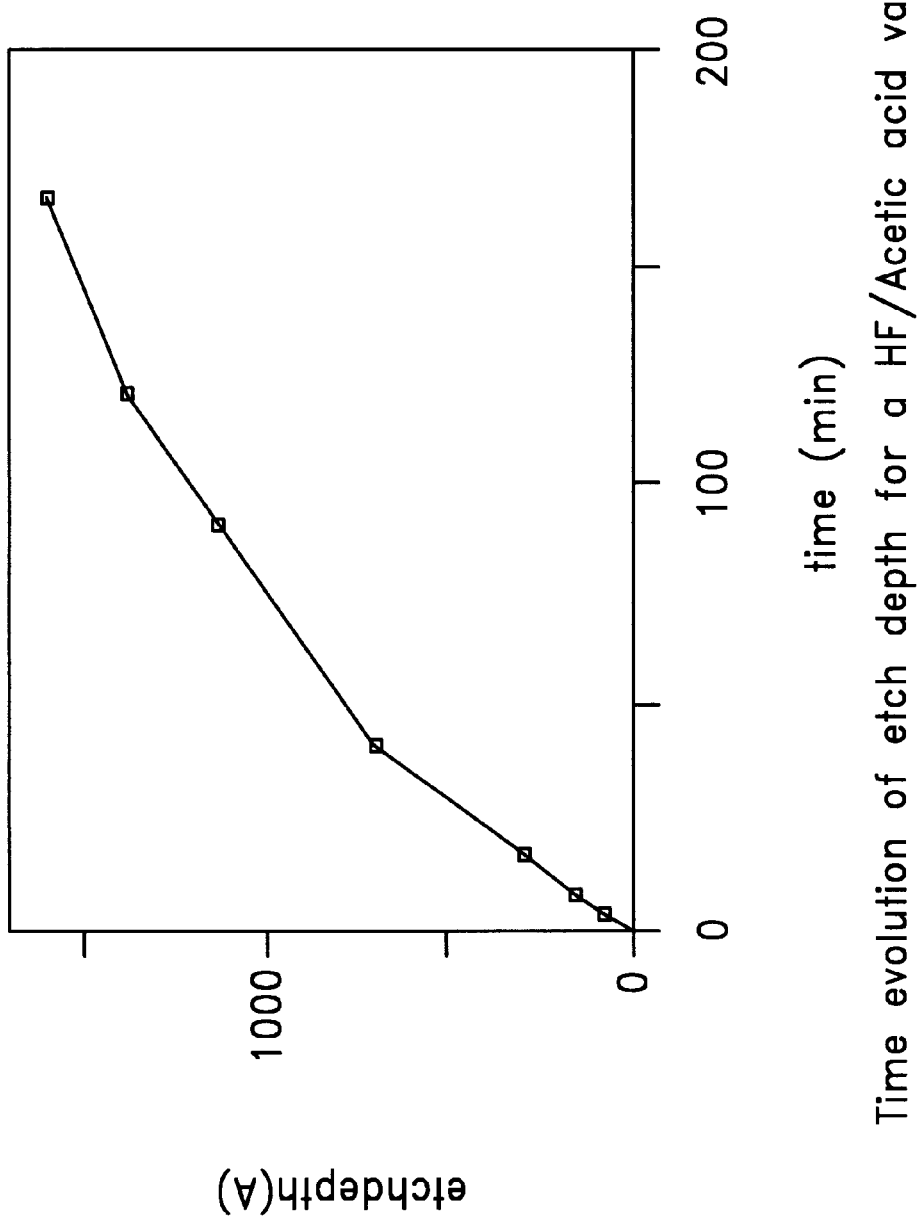
FIG. 3 is a diagram of the etch depth as a function of the etching time in HF/HAc vapors.

FIG. 3 illustrates as an example the etching behavior of a mixture in accordance with the invention. The etch depth as a function of time is shown when $SiO_2$ is etched in an HF/acetic acid gas phase mixture. As can be seen, the reproducibility is very good since the time evolution is very smooth. It must be noted that the processes which were run to generate this graph were run over different days and still the measured etch depths fall on a smooth curve showing the high degree of reproducibility.

Acetic acid appears to have a similar catalytic effect on the HF etch process as $H_2O$ because substantial etch rates are achieved. For the static etch mode, a perfectly proportional relation between etch time and etch depth is found until for large times the curve flattens out because of depletion effects. No incubation time can be observed.

In table 3, the etching uniformity of this process is examined in the same way as the $HF/H_2O$ vapor mixture. Good uniformity within the wafer (average standard deviation 6.05%) and good uniformity from wafer to wafer (standard deviation 3.5%) is achieved.

This shows that the process HF vapor/carboxylic acid yield much more uniform and reproducible etching than the $HF/H_2O$ process.

Figure 4:
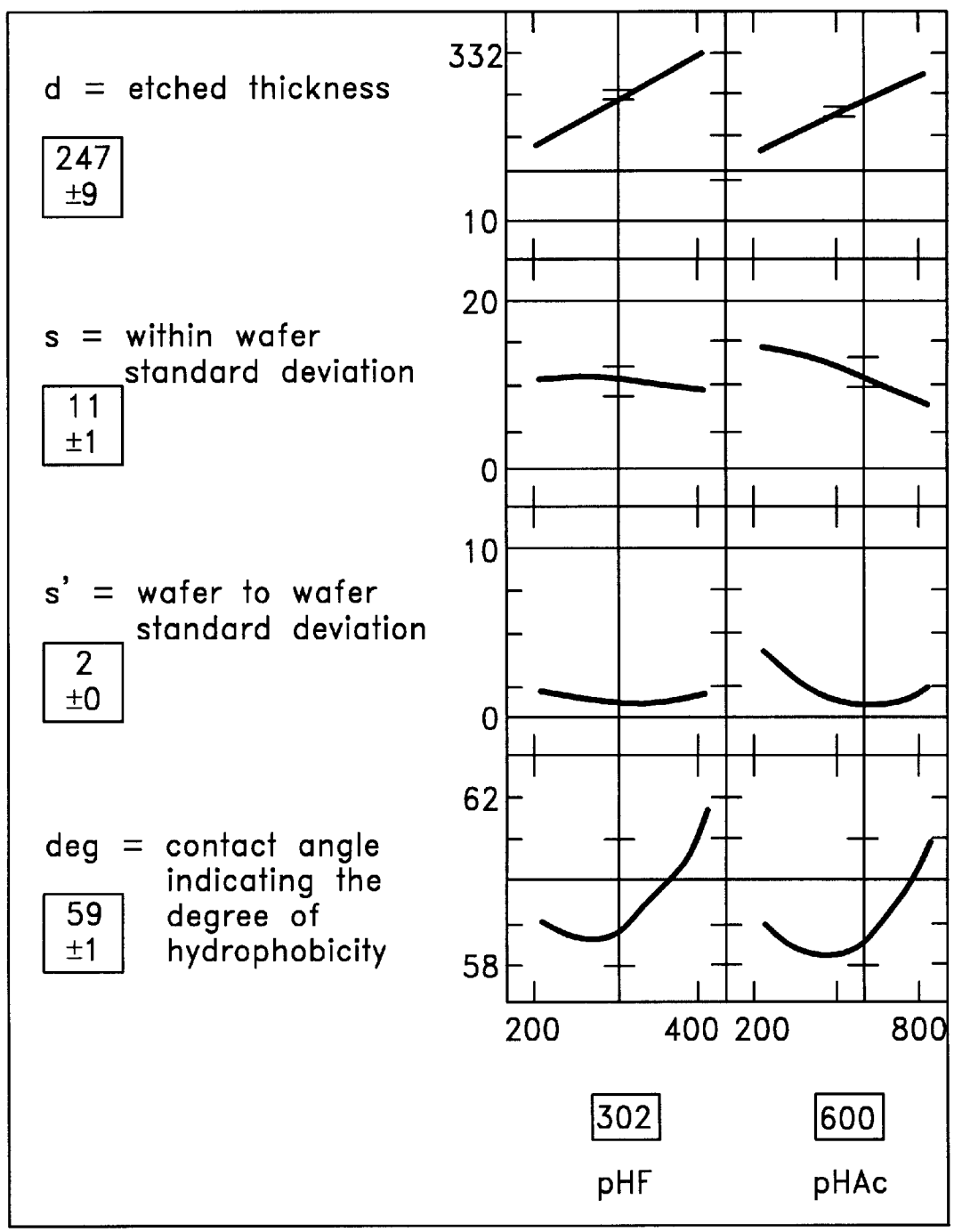
FIG. 4 is the interpretation of empirical model graphs.

The HF/acetic acid parameter space was investigated according to the matrix given in table 4. Modelling the results gave the graphs as presented in FIG. 4. The influence of acetic acid on the etching process is substantial. The acetic acid partial pressure provides a means to reduce the variation in etch depth over the wafer and over the batch and improves the controllability of the process.

These results relate to the etching of silicon oxide formed by the thermal oxidation of silicon in dry oxygen or in water vapor. For silicon oxide films formed by chemical vapor deposition the etch rate is typically higher. In table 5 the etch rate selectivity which is the ratio of the etch rate of silicon oxide formed by thermal decomposition of Tetra Ethyl Ortho Silicate (TEOS) and the etch rate of silicon oxide formed by thermal oxidation of silicon is given for two process:

1) a liquid mixture of 0.5 vol % HF in $H_2O$,
2) a vapor mixture of HF and acetic acid according to the present invention.

Densification of the TEOS oxide after deposition substantially reduces the etch rate but the etch rate still remains higher than that of thermal oxide. In general it is to be preferred that the selectivity is close to 1 to allow a controlled removal of different types of oxides that can simultaneously be present. The performance of the HF/acetic acid mixture is in this respect approximately equivalent to the liquid mixture.

Tests for particle contamination showed in the HF/acetic acid vapor etch process an average increase of 46 light point defects (0.12 μm Latex Sphere Equivalent) per 125 mm wafer, which is very low.

The invention will be further elucidated referring to the following example.

EXAMPLE

The method according to the subject invention was realized in a reaction chamber equipped with three inlets: one for anhydrous HF, one for acetic acid and one for a dry $N_2$ purge. The gas lines for HF and acetic acid are heated to approximately 50° C. A metal bottle with anhydrous HF at room temperature is used as source for the HF vapor. Acetic acid is supplied from a quartz bottle which is maintained at 45° C. The flows of the vapors are controlled by Mass Flow Controllers. The inlet lines were combined at a distance of about 50 cm above the reactor. The reactor and associated equipment according to the invention was made from materials chemically resistant to the reactive HF/carboxylic acid/water mixtures. The reactor and some other parts were made of stainless steel and coated with Halar®. The wafer boat and the part of the gas lines that is exposed to the vapor mixtures were made of Monel. The gas lines that are exposed to only one of the individual vapors is made of electropolished stainless steel. A proper choice is of great importance as the entire purpose of the etch is defeated if the removal of the native oxide would lead to an excessive generation of particles from either the reactor walls, the wafer support structure, the gas feed lines, etc.

The reactor is loaded with a batch comprising 4–25 silicon wafers, being kept at ambient temperature. Subsequently, the reactor chamber loaded with wafers is evacuated. After evacuation, the valve to the pump is closed. After this the inlet of HAc vapor is opened and HAc vapor is injected into the reactor up to a pressure of 600 Pa. Then the HAc inlet is closed. After this, the HF inlet is opened, HF vapor is injected into the reactor up to a total pressure of 900 Pa (partial HF pressure is 300 Pa) and the HF inlet is closed. The wafers are subsequently kept isolated in the system for some time, in this case 200 seconds. After said time interval has elapsed, the pump valve is opened and the process gases are pumped away. Then the reactor is purged with dry $N_2$ to atmospheric pressure.

The results of this procedure were already presented in table 3.

Although the invention is described referring to a preferred embodiment, it has to be understood that the invention is not limited to this application. Other equipments, procedures and other carboxylic acids may be used.

TABLE 1

Etching results in $HF/H_2O$ vapor

| Wafer | Minimal etch depth (Å) | Maximal etch depth (Å) | Mean etch depth (Å) | Standard deviation |
|---|---|---|---|---|
| 1 | 38 | 150 | 85 | 38 |
| 2 | 26 | 106 | 50 | 32 |
| 3 | 38 | 104 | 61 | 26 |
| 4 | 38 | 113 | 65 | 26 |
| 5 | 18 | 97 | 43 | 37 |
| 6 | 22 | 89 | 45 | 34 |

TABLE 2

Surface area occupied by different molecules adsorbed on silicon dioxide

| Molecule | Formula | Surface area/molecule (Å**2) |
|---|---|---|
| Acetic Acid | $CH_3COOH$ | 9.1 |
| Water | $H_2O$ | 12.5 |
| Nitrogen | $N_2$ | 16.4 |
| Methanol | $CH_3OH$ | 18.0 |
| Ethanol | $C_2H_5OH$ | 18.0 |
| n-Propanol | $C_3H_7OH$ | 21.3 |
| Hexene | $C_6H_6$ | 55.0 |

TABLE 3

Etching results in HF/HAc vapor

| Wafer | Minimal etch depth (Å) | Maximal etch depth (Å) | Mean etch depth (Å) | Standard deviation |
|---|---|---|---|---|
| 1 | 71 | 97 | 84 | 5.8 |
| 2 | 75 | 100 | 89 | 7.7 |
| 3 | 72 | 97 | 86 | 6.2 |
| 4 | 71 | 91 | 82 | 4.6 |

TABLE 4

Experimental matrix to investigate the HAc/HF parameter space

| $P_{HF}$ Pa | $P_{HAc}$ Pa | Etch depth Å | p-p deviation % | w-w deviation % | contact angle ° |
|---|---|---|---|---|---|
| 200 | 200 | 83.5 | 15.9 | 2.4 | 59.8 |
| 400 | 200 | 200.5 | 13.4 | 7.6 | 62.0 |
| 200 | 800 | 181.6 | 7.7 | 4.9 | 61.1 |
| 400 | 800 | 395.3 | 6.7 | 1.6 | 62.9 |
| 300 | 500 | 216.1 | 11.6 | 1.7 | 58.1 |
| 300 | 200 | 155.9 | 14.5 | 4.4 | 58.9 |
| 200 | 500 | 148.1 | 12.6 | 1.4 | 58.8 |
| 300 | 800 | 288.7 | 10.2 | 2.6 | 62.8 |
| 400 | 500 | 299.7 | 12.1 | 2.9 | 62.5 |

TABLE 5

Etch rate selectivity for TEOS oxide/thermal oxide

| Mixture | As-deposited | Half densified | Densified |
|---|---|---|---|
| liquid, 0.5 vol % HF in H2O | 8.5 | 5.0 | 1.4 |
| vapor, 300 Pa HF, 600 Pa HAc | 12.0 | 4.1 | 1.4 |
| As-deposited TEOS oxide | 725 ° C., low pressure | | |
| Half densified TEOS oxide | 850° C. for 0.5 h in $N_2$ | | |
| Densified TEOS oxide | 1050° C. for 1 h in $N_2$ | | |

What is claimed is:

1. A method for etching silicon oxide layers on a silicon substrate, comprising the steps of:

loading said silicon substrate in a reactor; and injecting in said reactor a mixture of gases comprising hydrogen fluoride and at least one carboxylic acid while maintaining said mixture in the gas phase in said reactor, the gas phase etching process conditions on the surface of said substrate being such that water being generated on the surface of said substrate during the gas phase etching process is transported away by evaporation.

2. The method as recited in claim 1 wherein the temperature of said substrate is kept at a value between 0° C. and 99° C.

3. The method as recited in claim 1 wherein the temperature of said substrate is kept at a value between 0° C. and 50° C.

4. The method as recited in claim 3 wherein the temperature of said substrate is kept at room temperature.

5. The method as recited in claim 1 wherein the partial vapor pressures of HF and the carboxylic acid are between 1 Pa and $10^4$ Pa.

6. The method as recited in claim 1, wherein the partial vapor pressures of HF and the carboxylic acid are between 100 Pa and 1000 Pa.

7. The method as recited in claim 6 wherein the partial vapor pressure of HF is 300 Pa and the partial vapor pressure of the carboxylic acid is 600 Pa.

8. The method as recited in claim 1 wherein the carboxylic acid is acetic acid.

9. The method as recited in claim 1 wherein said mixture further comprises water vapor or other gases.

10. The method as recited in claim 9, wherein said mixture further comprises a gas selected from the group consising of Ar, $N_2$ and $H_2$.

11. The method as recited in claim 1 wherein said step of injecting said reactor with said mixture of gases comprises the steps of:

filling said reactor with said mixture of gases up to a predetermined pressure; and thereafter keeping said reactor isolated for a period of time to thereby perform said gas phase etching process in the static mode.

12. The method as recited in claim 1 wherein said step of injecting said reactor with said mixture of gases comprises the steps of:

feeding a flow of said mixture of gases into said reactor while maintaining said reactor at a predetermined pressure to thereby perform said gas phase etching process in the dynamic mode.

13. The method as recited in claim 1 wherein said mixture further comprises HCl.

14. The method as recited in claim 1 wherein said mixture further comprises organic solvents.

15. The method as recited in claim 14, wherein the organic solvents are selected from the group consisting of alcohols, ketones, aldehydes, and esters.

16. The method as recited in claim 1 wherein the temperature of said substrate is kept at a value between 0° C. and 400° C.

17. The method as recited in claim 1, wherein the temperature of said substrate is kept at a value between 0° C. and below about 100° C.

18. The method as recited in claim 1, wherein the temperature of said substrate is kept at ambient temperature.

* * * * *

UNITED STATES PATENT AND TRADEMARK OFFICE
CERTIFICATE OF CORRECTION

PATENT NO. : 5,922,624
DATED : 7/13/99
INVENTOR(S) : Verhaverbeke, et al.

It is certified that error appears in the above-indentified patent and that said Letters Patent is hereby corrected as shown below:

On the title page: Item [73] Assignee:

Additional Assignee:

Advanced Semiconductor Materials Naamloze Vennootschap (ASM), Bilthoven, Netherlands Signed and Sealed this Seventeenth Day of April, 2001

*Attest:*

NICHOLAS P. GODICI

*Attesting Officer*    *Acting Director of the United States Patent and Trademark Office*